US012132085B2

(12) United States Patent
Suo et al.

(10) Patent No.: US 12,132,085 B2
(45) Date of Patent: Oct. 29, 2024

(54) SiC SUBSTRATE AND SIC EPITAXIAL WAFER

(71) Applicant: Resonac Corporation, Tokyo (JP)

(72) Inventors: Hiromasa Suo, Ichihara (JP); Rimpei Kindaichi, Yokohama (JP)

(73) Assignee: Resonac Corporation, Tokyo (JP)

( * ) Notice: Subject to any disclaimer, the term of this patent is extended or adjusted under 35 U.S.C. 154(b) by 0 days.

(21) Appl. No.: 18/114,632

(22) Filed: Feb. 27, 2023

(65) Prior Publication Data

US 2023/0387214 A1 Nov. 30, 2023

(30) Foreign Application Priority Data

May 31, 2022 (JP) ................. 2022-089095

(51) Int. Cl.
*H01L 29/16* (2006.01)
*H01L 21/66* (2006.01)
*H01L 21/67* (2006.01)

(52) U.S. Cl.
CPC .... *H01L 29/1608* (2013.01); *H01L 21/67288* (2013.01); *H01L 22/12* (2013.01)

(58) Field of Classification Search
CPC ............... H01L 21/67288; H01L 22/12; H01L 29/1608; C30B 23/025; C30B 23/06; C30B 25/20; C30B 29/36
USPC .......................................................... 438/14
See application file for complete search history.

(56) References Cited

U.S. PATENT DOCUMENTS

| 2013/0009170 | A1  |   | 1/2013 | Momose et al. |
|---|---|---|---|---|
| 2016/0231256 | A1  |   | 8/2016 | Kojima et al. |
| 2019/0194822 | A1  | * | 6/2019 | Kindaichi ............. C30B 29/605 |
| 2019/0194824 | A1  | * | 6/2019 | Fujikawa .............. C30B 29/605 |
| 2019/0273136 | A1  | * | 9/2019 | Masumoto .......... H01L 29/1608 |
| 2020/0199745 | A1  | * | 6/2020 | Umeta ............. H01L 21/02378 |
| 2021/0198804 | A1  | * | 7/2021 | Khlebnikov .......... C30B 23/066 |

FOREIGN PATENT DOCUMENTS

| JP | 2007-290880 A | 11/2007 |  |
|---|---|---|---|
| JP | 2011-219296 A | 11/2011 |  |
| JP | 2015-059073 A | 3/2015 |  |
| JP | 2017-069334 A | 4/2017 |  |
| JP | 2021-102533 A | 7/2021 |  |
| WO | WO-2012157870 A2 * | 11/2012 | ........... H04B 17/318 |
| WO | 2019/111507 A1 | 6/2019 |  |

OTHER PUBLICATIONS

Notice of Allowance of Japanese Application No. 2022-089095 dated Jul. 26, 2022.

* cited by examiner

*Primary Examiner* — Fazli Erdem

(74) *Attorney, Agent, or Firm* — Sughrue Mion, PLLC

(57) ABSTRACT

The SiC substrate has a warpage factor F of 300 μm or less, which is obtained from the thickness, the diameter, and a stress at a first outer circumferential end 10 mm inward from an outer circumferential end in the [11-20] direction from a center thereof.

30 Claims, 7 Drawing Sheets

SiC SUBSTRATE AND SiC EPITAXIAL WAFER

BACKGROUND OF THE INVENTION

Field of the Invention

The present invention relates to a SiC substrate and a SiC epitaxial wafer. Priority is claimed on Japanese Patent Application No. 2022-089095, filed May 31, 2022, the content of which is incorporated herein by reference.

Description of Related Art

Silicon carbide (SiC) has a dielectric breakdown field that is one order of magnitude larger and a bandgap that is three times larger than silicon (Si). In addition, silicon carbide (SiC) has properties such as a thermal conductivity that is about three times greater than silicon (Si). For that reason, silicon carbide (SiC) is expected to be applied to power devices, high-frequency devices, high-temperature operation devices, and the like. For this reason, in recent years, SiC epitaxial wafers have come to be used for such semiconductor devices.

A SiC epitaxial wafer is obtained by laminating a SiC epitaxial layer on a surface of a SiC substrate cut out from a SiC ingot. Hereinafter, a substrate before a SiC epitaxial layer is laminated thereon is referred to as a SiC substrate, and a substrate after a SiC epitaxial layer has been laminated thereon is referred to as a SiC epitaxial wafer.

A SiC substrate before a SiC epitaxial layer is laminated is flat. There are various processing processes before a semiconductor device is manufactured from the SiC substrate. A SiC substrate may warp after processing processes. Processing processes that cause warpage of a SiC substrate include, for example, epitaxial layer deposition, surface polishing, oxide film formation, ion implantation, and the like. Warpage of a SiC substrate adversely affects processes of a semiconductor device. For example, the warpage causes defocus in photolithographic processing. The warpage also causes a decrease in positional accuracy of a wafer during a transfer process.

On the other hand, as mentioned above, a SiC substrate before processing is flat, and it is difficult to predict the warpage after processing. For example, Patent Document 1 describes using a difference in wavenumber shift amount of Raman scattered light in order to predict a warpage value of a SiC single crystal product wafer after completion of a polishing process before the polishing process is completed. Patent Document 2 discloses a substrate in which a Raman spectrum is measured in a thickness direction of a substrate and a stress distribution is reduced in the thickness direction. Also, for example, Patent Document 3 describes that warpage of a SiC substrate is reduced by relaxing crystallographic stress. Further, for example, Patent Document 4 describes inhibiting cracks in an ingot by increasing a compressive stress in a circumferential direction of the ingot.

PATENT DOCUMENTS

[Patent Document 1] Japanese Unexamined Patent Application, First Publication No. 2015-59073
[Patent Document 2] PCT International Publication No. WO 2019/111507
[Patent Document 3] United States Patent Application Publication No. 2021/0198804
[Patent Document 4] Japanese Unexamined Patent Application, First Publication No. 2007-290880

SUMMARY OF THE INVENTION

Patent Documents 1 and 2 use a Raman shift to evaluate internal stress of a substrate, but the Raman shift does not include directional information. Further, Patent Documents 1 to 3 describe reducing stress, but warpage of a SiC epitaxial wafer could not be sufficiently inhibited only by reducing stress. Moreover, the stress defined in Patent Document 4 is stress of an ingot, which is different from the stress associated with a SiC substrate.

The present invention has been made in view of the above problems, and an object thereof is to provide a SiC substrate and a SiC epitaxial wafer that are less likely to warp even after processing.

The present inventors have found a new function (a warpage factor) that correlates with warpage after processing using stress at an outer circumferential portion, a diameter, and a thickness. It has been found that, by inhibiting the warpage factor below a certain value, the warpage after processing can be inhibited and obstruction to device flow can be inhibited. In order to solve the above problems, the present invention provides the following means.

(1) A SiC substrate according to a first aspect having a warpage factor F of 300 μm or less represented by the following formula (1) obtained from a thickness, a diameter, and a stress at a first outer circumferential end 10 mm inward from an outer circumferential end in the [11-20] direction from a center thereof.

Here, the formula (1) is expressed as $$F = K \times \exp(a + b \times \ln(\sigma) + c \times \ln(R) + d \times \ln(t_s)) \quad (1).$$

In the formula (1), K, a, b, c, and d are constants satisfying K=1.3373, a=−11.67123, b=1.4030953, c=1.8050972, and d=−1.585898, α satisfies α=60 (MPa)−⅔×S (MPa), S is internal stress in the <1-100> direction, which is the same direction as a circumferential direction of the first outer circumferential end, and in which tensile stress is defined as positive and compressive stress is defined as negative, $t_s$ is the thickness (mm), and R is the diameter (mm).

(2) In the SiC substrate according to the above aspect, the warpage factor F may be 200 μm or less.
(3) In the SiC substrate according to the above aspect, the warpage factor F may be 100 μm or less.
(4) In the SiC substrate according to the above aspect, the warpage factor F may be 50 μm or less.
(5) In the SiC substrate according to the above aspect, the diameter may be 145 mm or more, and the thickness may be 300 μm or less.
(6) In the SiC substrate according to the above aspect, the diameter may be 195 mm or more, and the thickness may be 600 μm or less.
(7) In the SiC substrate according to the above aspect, the thickness may be 400 μm or less.
(8) In the SiC substrate according to the above aspect, the diameter may be 210 mm or more, and the thickness may be 600 μm or less.
(9) In the SiC substrate according to the above aspect, the diameter may be 290 mm or more, and the thickness may be 800 μm or less.
(10) In the SiC substrate according to the above aspect, the thickness may be 600 μm or less.
(11) A SiC epitaxial wafer according to a second aspect includes the SiC substrate according to the above aspect, and a SiC epitaxial layer laminated on one surface of the SiC substrate.

The SiC substrate and the SiC epitaxial wafer according to the above aspects are less likely to warp even after processing processes.

DETAILED DESCRIPTION OF THE INVENTION

Figure 1:
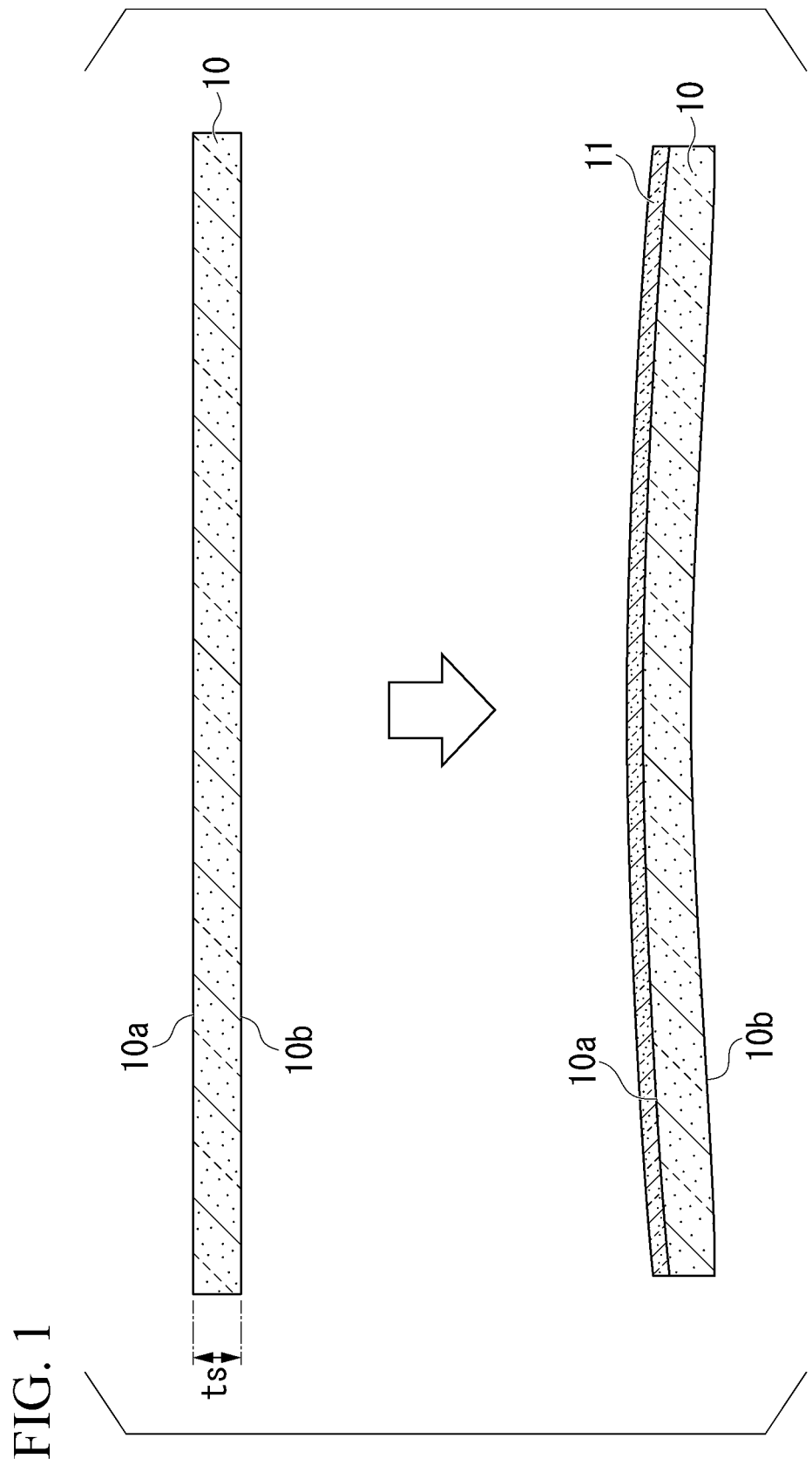
FIG. 1 is a schematic diagram showing warpage of a SiC substrate.

A SiC substrate and the like according to the present embodiment will be described in detail below with reference to the drawings as appropriate. In the drawings used in the following description, there are cases in which featured portions are shown enlarged for the sake of convenience in order to make it easier to understand features of the present embodiment, and dimensional ratios and the like of respective constituent elements may be different from actual ones. Materials, dimensions, and the like provided in the following description are exemplary examples, and the present invention is not limited thereto and can be appropriately modified without changing the gist thereof.

First, warpage of a SiC substrate 10 will be described. FIG. 1 is a schematic diagram showing the warpage of the SiC substrate 10.

The SiC substrate 10 before processing is substantially flat. The expression "substantially flat" means that there is no portion that rises significantly when placed on a flat surface. For example, a first surface 10a and a second surface 10b of the SiC substrate 10 before processing are substantially parallel to each other. The first surface 10a and the second surface 10b are opposite surfaces of the SiC substrate 10.

After processing processes, a processed layer 11 is formed on the first surface 10a of the SiC substrate 10. The processed layer 11 is formed by, for example, surface treatment, film formation, device formation, or the like. When the processed layer 11 is formed on one surface of the SiC substrate 10, the SiC substrate 10 may warp.

For example, the processed layer 11 formed by surface treatment is an affected layer. For example, when the first surface 10a is a mirror-ground surface and the second surface 10b is a CMP-processed surface, the affected layer is formed on the first surface 10a. The Twyman effect occurs in the SiC substrate 10 due to a difference in surface state between the first surface 10a and the second surface 10b. The Twyman effect is a phenomenon in which, in a case in which there is a difference in residual stress on both surfaces of a substrate, a force acts to compensate for the difference in stress on both surfaces. The Twyman effect may cause the SiC epitaxial wafer 20 to warp.

Also, for example, the processed layer 11 formed by film formation is an epitaxial layer. The epitaxial layer is deposited on a first surface 10a of the SiC substrate 10, for example. The SiC substrate 10 may warp due to a difference in state between the first surface 10a on which the epitaxial layer is formed and the second surface 10b.

Also, for example, the processed layer 11 formed by device formation is a device layer. For example, diodes and transistors are formed in the device layer. For example, when ion implantation or the like is performed to form a device in an epitaxial layer, the SiC substrate 10 may warp. This is because a state is different between an ion-implanted surface and a non-ion-implanted surface.

Here, one example of causes of the warpage of the SiC substrate 10 due to the processing processes has been presented, but the causes of the warpage are not limited thereto, and these causes may affect it in a complex manner. For that reason, it has been difficult to predict a degree of the warpage after the processing processes in the state of the SiC substrate 10. In the SiC substrate according to the present embodiment, the degree of the warpage after the processing processes is defined by a newly defined warpage factor F.

Figure 2:
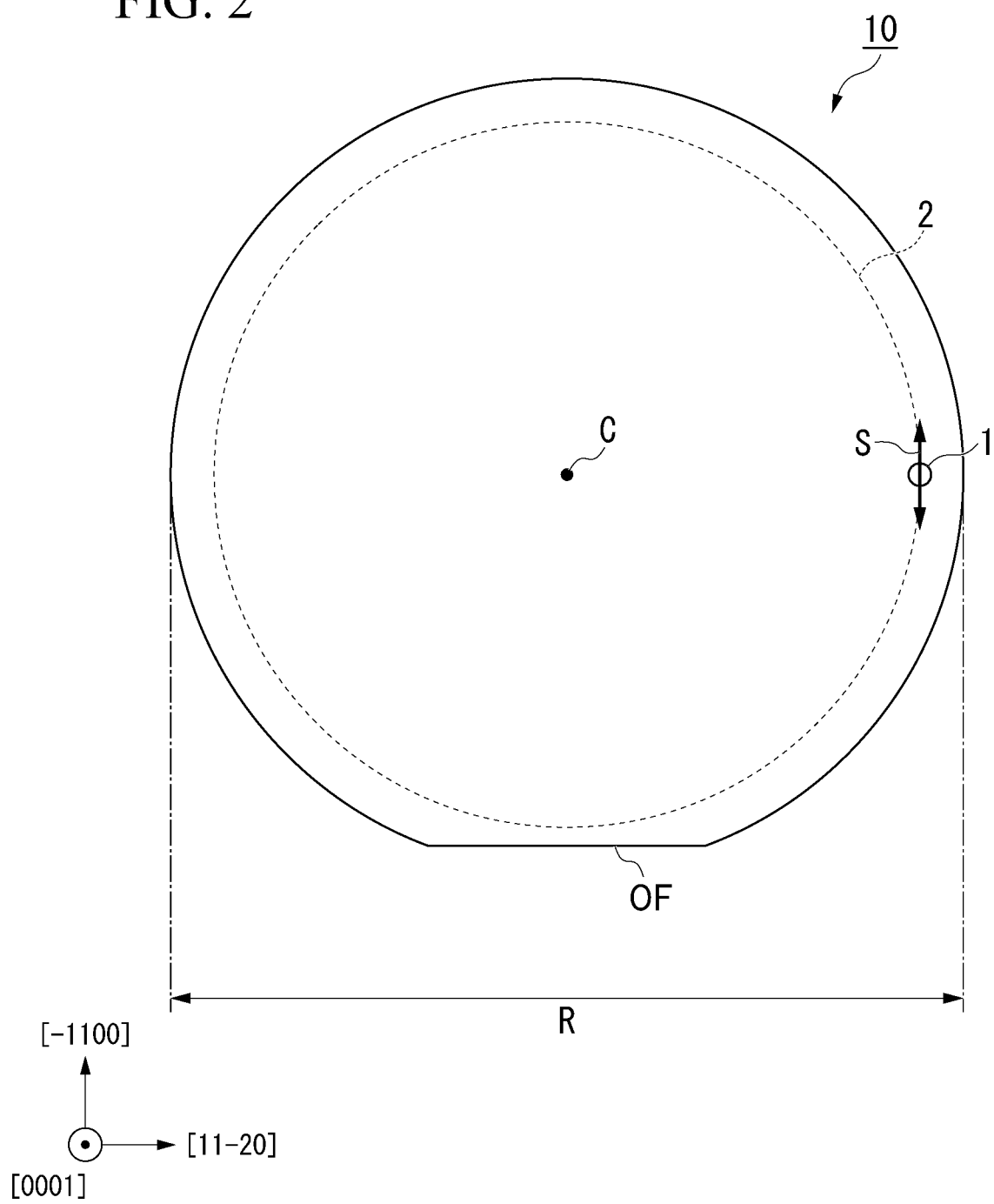
FIG. 2 is a plan view of the SiC substrate according to the present embodiment.

FIG. 2 is a plan view of the SiC substrate 10 according to the present embodiment. The SiC substrate 10 is made of SiC. A polytype of the SiC substrate 10 is not particularly limited and may be any of 2H, 3C, 4H, and 6H. The SiC substrate 10 is, for example, 4H—SiC. The shape of the SiC substrate 10 in a plan view is substantially circular. The SiC substrate 10 may have an orientation flat OF or a notch for determining a direction of a crystal axis thereof.

The warpage factor F is a parameter obtained from a thickness $t_s$ (see FIG. 1), a diameter R, and stress S at a first outer circumferential end 1 of the SiC substrate 10.

The warpage factor F is represented by the following formula (1).

$$F = K \times \exp(a + b \times \ln(\sigma) + c \times \ln(R) + d \times \ln(t_s)) \quad (1)$$

In the formula (1), K, a, b, c, and d are constants. They satisfy K=1.3373, a=−11.67123, b=1.4030953, c=1.8050972, and d=−1.585898. σ satisfies σ=60 (MPa)–⅔×S (MPa). S is the stress at the first outer circumferential end 1. $t_s$ is the thickness (mm) of the SiC substrate 10 and R is the diameter (mm) of the SiC substrate 10.

The first outer circumferential end 1 is located at an outer circumferential portion 2 10 mm inward from an outer circumferential end and is a point located in the [11-20] direction from a center C thereof. The stress S is an internal stress in the <1-100> direction, which is the same direction as a circumferential direction of the first outer circumferential end 1. Also, in the present invention, when the stress S is a tensile stress, it is treated as positive, and when it is a compressive stress, it is treated as negative. At the time of discussing a magnitude of the stress S, the magnitude is defined by an absolute value.

The stress S is calculated as a product of a strain ε and a Young's modulus. The strain ε is obtained by $(a_0-a)/a_0$. $a_0$ is a reference lattice constant. $a_0$ is about 3.08 Å in the case of 4H—SiC. a is a lattice constant determined by an X-ray diffraction method (XRD). A direction of the stress S is obtained from a direction of incident X-rays in X-ray diffraction. As the lattice constant a becomes smaller than a reference lattice constant $a_0$, the strain ε increases and the tensile stress increases. As the lattice constant a becomes larger than the reference lattice constant $a_0$, the strain ε increases and the tensile stress increases.

Figure 3:
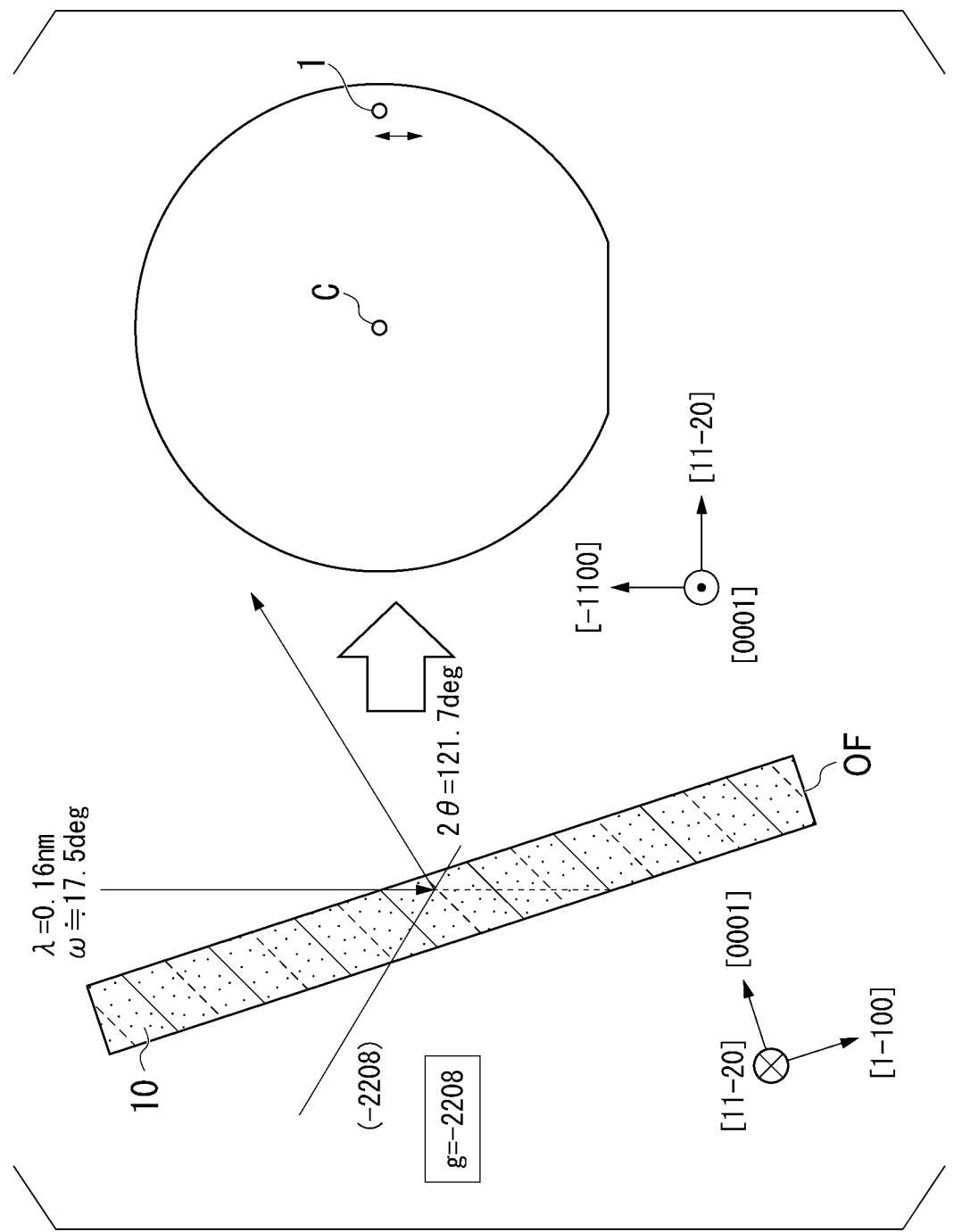
FIG. 3 is a schematic diagram showing a method for measuring stress S in a circumferential direction of a first outer circumferential end.

FIG. 3 is a schematic diagram showing a method for measuring the stress S in the circumferential direction of the first outer circumferential end 1. The circumferential direction at the first outer circumferential end 1 is a direction orthogonal to a line segment that connects the center C of the SiC substrate 10 to the first outer circumferential end 1 (hereinafter referred to as a first direction). The first direction is the <1-100> direction. In the case of measuring the stress in the circumferential direction at the first outer circumferential end 1, X-rays are radiated in the first direction. By making X-rays incident on the SiC substrate 10 in the circumferential direction, the lattice constant a in the circumferential direction at the first outer circumferential end 1 is obtained. Then, using this lattice constant a, the stress S in the circumferential direction at the first outer circumferential end 1 is obtained from the above formula. In addition, when the actually measured lattice constant a is smaller than the reference lattice constant $a_0$, tensile stress is assumed to be acting, and when the actually measured lattice constant a is greater than the reference lattice constant $a_0$, compressive stress is assumed to be acting.

The warpage factor F is, for example, 300 μm or less, preferably 200 μm or less, more preferably 100 μm or less, and even more preferably 50 Lm or less.

The value of the warpage factor F is satisfied preferably when the diameter of the SiC substrate 10 is 145 mm or more, more preferably when the diameter is 195 mm or more, even more preferably when the diameter is 210 mm or more, and particularly preferably when the diameter is 290 mm or more.

The value of the warpage factor F is satisfied preferably when the thickness $t_s$ of the SiC substrate 10 is 800 μm or less, more preferably when the thickness $t_s$ is 600 m or less, even more preferably when the thickness $t_s$ is 400 μm or less, and particularly preferably when the thickness $t_s$ is 300 min or less.

For example, in a case in which the SiC substrate 10 has the diameter of 290 mm or more and the thickness of 800 μm or less, the warpage factor F is preferably 300 μm or less, more preferably 200 μm or less, even more preferably 100 μm or less, and particularly preferably 50 μm or less. Also, in a case in which the SiC substrate 10 has the diameter of 290 mm or more and the thickness of 600 μm or less, the warpage factor F is preferably 300 μm or less, more preferably 200 μm or less, even more preferably 100 μm or less, and particularly preferably 50 μm or less.

For example, in a case in which the SiC substrate 10 has the diameter of 210 mm or more and the thickness of 600 μm or less, the warpage factor F is preferably 300 μm or less, more preferably 200 μm or less, even more preferably 100 μm or less, and particularly preferably 50 μm or less.

For example, in a case in which the SiC substrate 10 has the diameter of 195 mm or more and the thickness of 600 μm or less, the warpage factor F is preferably 100 μm or less and more preferably 50 μm or less. Also, in a case in which the SiC substrate 10 has the diameter of 195 mm or more and the thickness of 400 μm or less, the warpage factor F is preferably 200 μm or less, more preferably 100 μm or less, and even more preferably 50 μm or less.

For example, in a case in which the SiC substrate 10 has the diameter of 145 mm or more and the thickness of 300 μm or less, the warpage factor F is preferably 100 μm or less and more preferably 50 μm or less.

Figure 4:
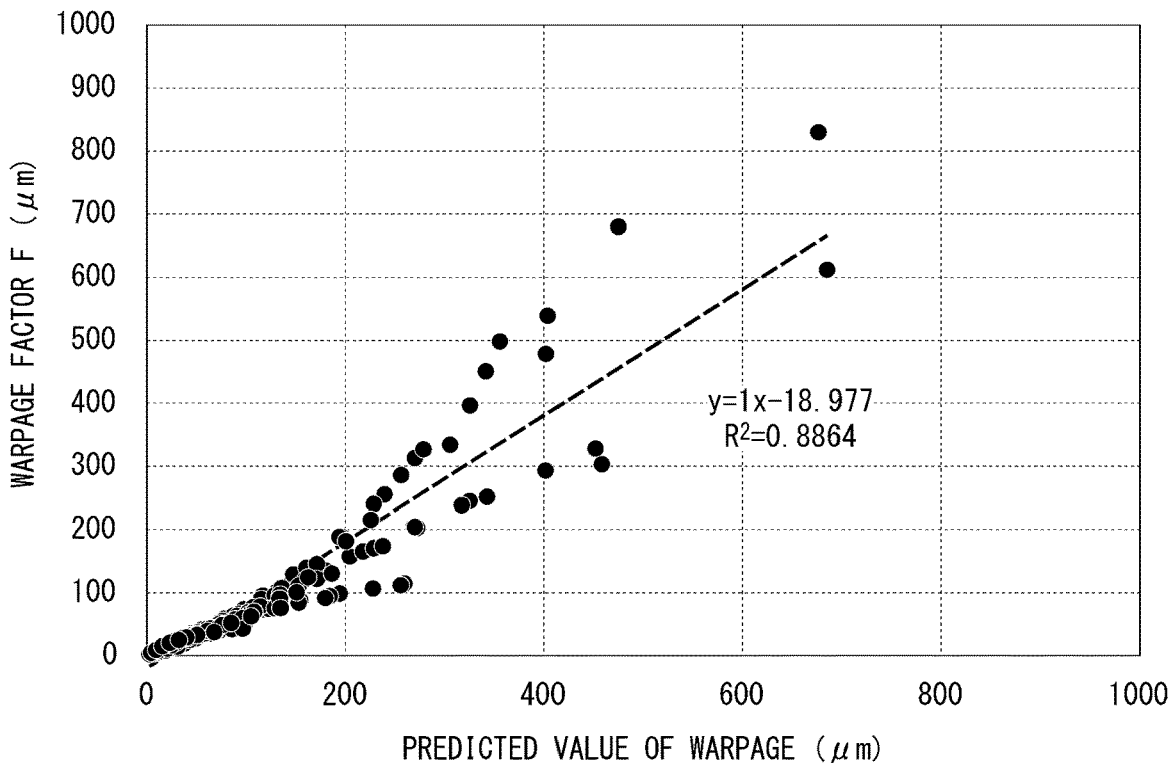
FIG. 4 is a diagram showing a relationship between a predicted (simulated) value of the warpage of the SiC substrate and a warpage factor.

FIG. 4 is a diagram showing a relationship between a predicted value of the warpage of the SiC substrate and the warpage factor F. The warpage factor F was obtained on the basis of the above formula (1).

The predicted value of the warpage of the SiC substrate was obtained by simulation. The simulation was performed using a finite element method simulator ANSYS. It was separately confirmed that the simulation using the finite element method simulator ANSYS matched results of actually manufactured products. The predicted value of the warpage is a distance in the thickness direction between the highest point and the lowest point of the first surface 10a and corresponds to Warp.

The simulation was performed according to the following procedure. First, physical property values of the SiC substrate and the surface layer with different stresses were set. The physical property values to be set are a thickness of the SiC substrate, a thickness of the surface layer, a Young's modulus, and a Poisson's ratio. Various thicknesses and diameters of the SiC substrate were set as shown in Examples described later. The SiC substrate was set to have a Young's modulus of 480 GPa and a Poisson's ratio of 0.20. The film thickness of the surface layer was 10 μm. Here, in consideration of a case in which the stress is generated in the surface layer by ion implantation, the same values as those of the SiC substrate were used for the Young's modulus and the Poisson's ratio of the surface layer.

Next, a stress distribution of the SiC substrate and the stress of the surface layer were set. First, the stress distribution of the SiC substrate was set. The stress applied to the SiC substrate was either +60 MPa, +30 MPa, 0 MPa, or −30 MPa. Stress of 60 MPa was applied to the entire surface layer. The simulation was performed under the above conditions to obtain the warpage of the SiC substrate with the surface layer.

As shown in FIG. 4, the warpage factor F has a proportional relationship with the predicted value of the warpage obtained from the simulation. The warpage factor F reflects an amount of the warpage of the SiC substrate 10. That is, by controlling the warpage factor F, the warpage after the processing processes can be controlled. Further, when the warpage factor F has been obtained, it is possible to easily predict the amount of the warpage after the SiC substrate 10 has passed through the processing process without performing a simulation or the like.

Next, an example of a method for manufacturing the SiC substrate 10 according to the present embodiment will be described. The SiC substrate 10 is obtained by slicing a SiC ingot. The SiC ingot is obtained, for example, by a sublimation method.

Figure 5:
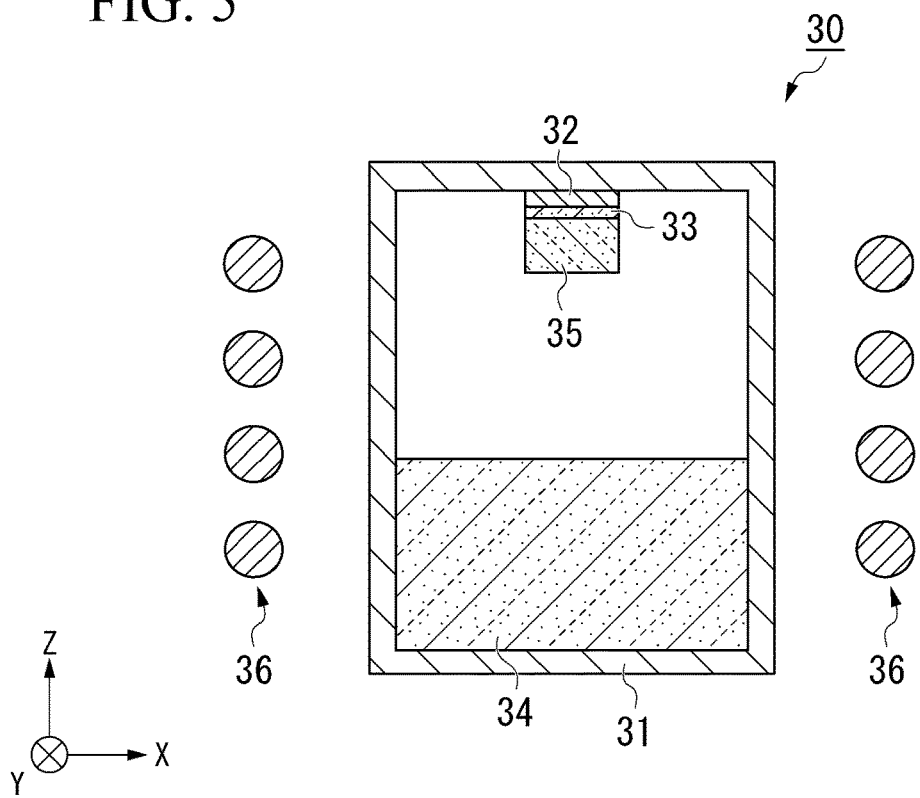
FIG. 5 is a schematic diagram showing a sublimation method, which is an example of a manufacturing device of a SiC ingot.
Figure 6:
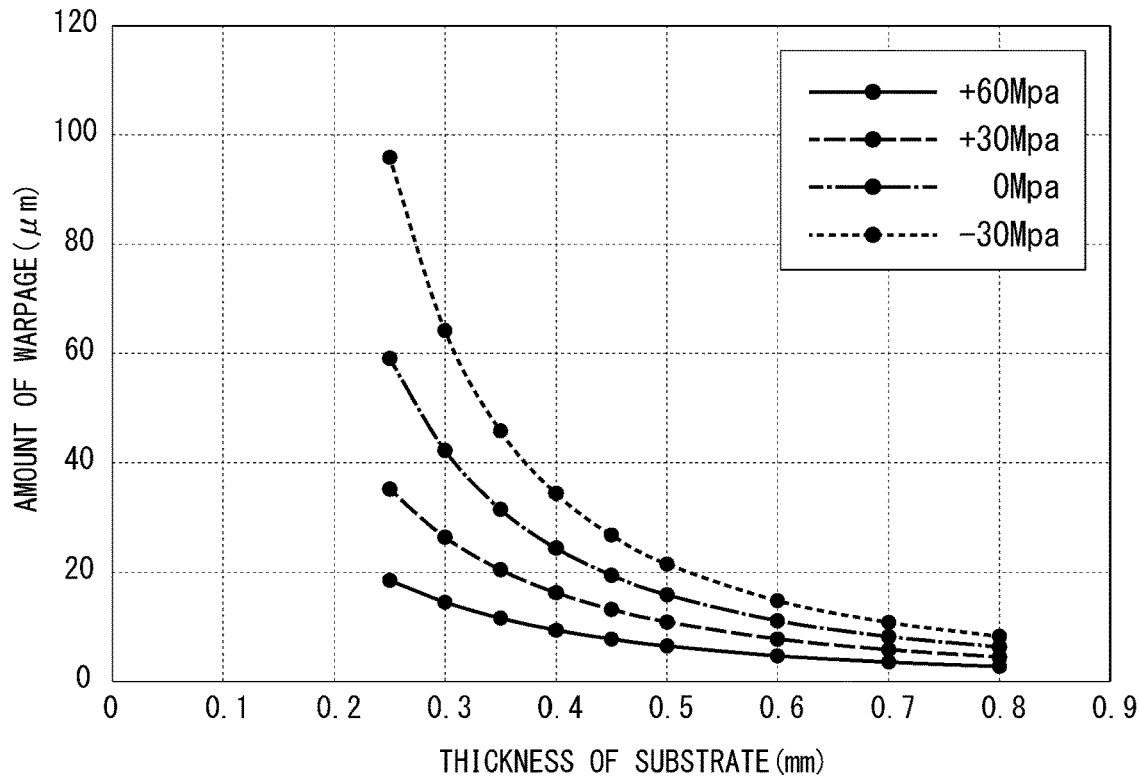
FIG. 6 shows simulation results of warpage of a SiC substrate in Example 1.
Figure 7:
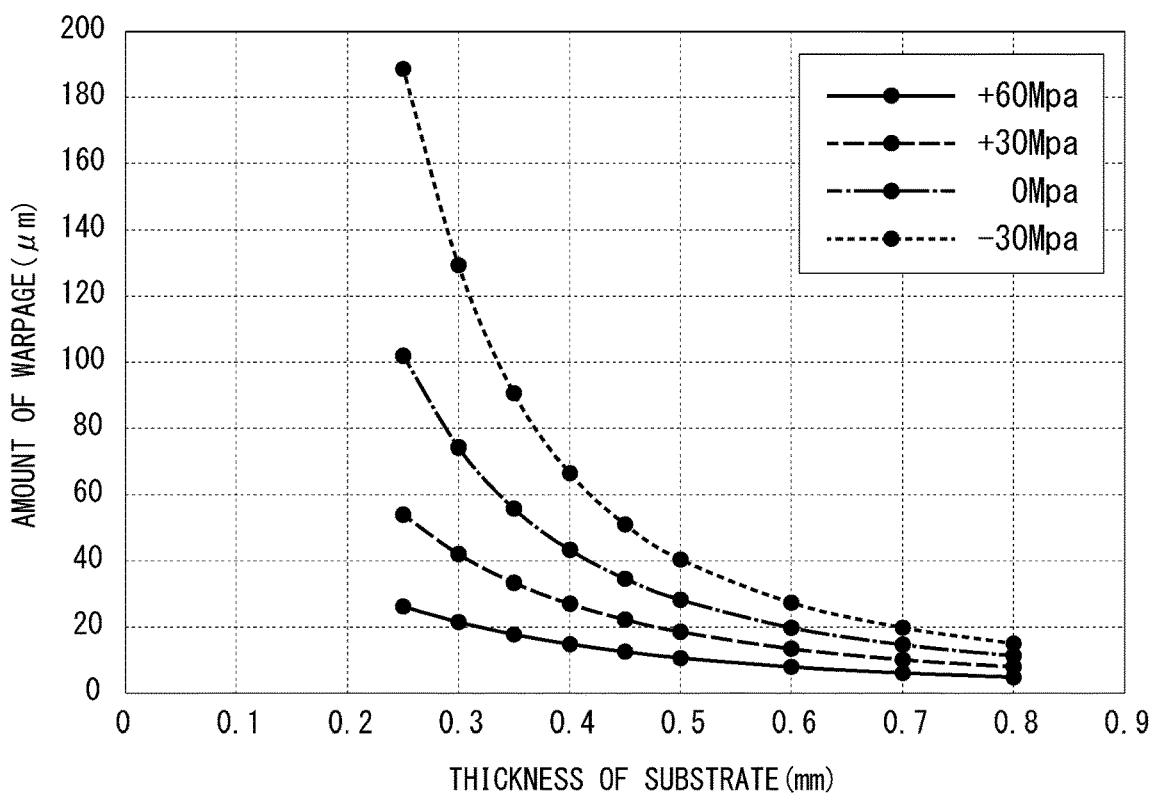
FIG. 7 shows simulation results of warpage of a SiC substrate in Example 2.
Figure 8:
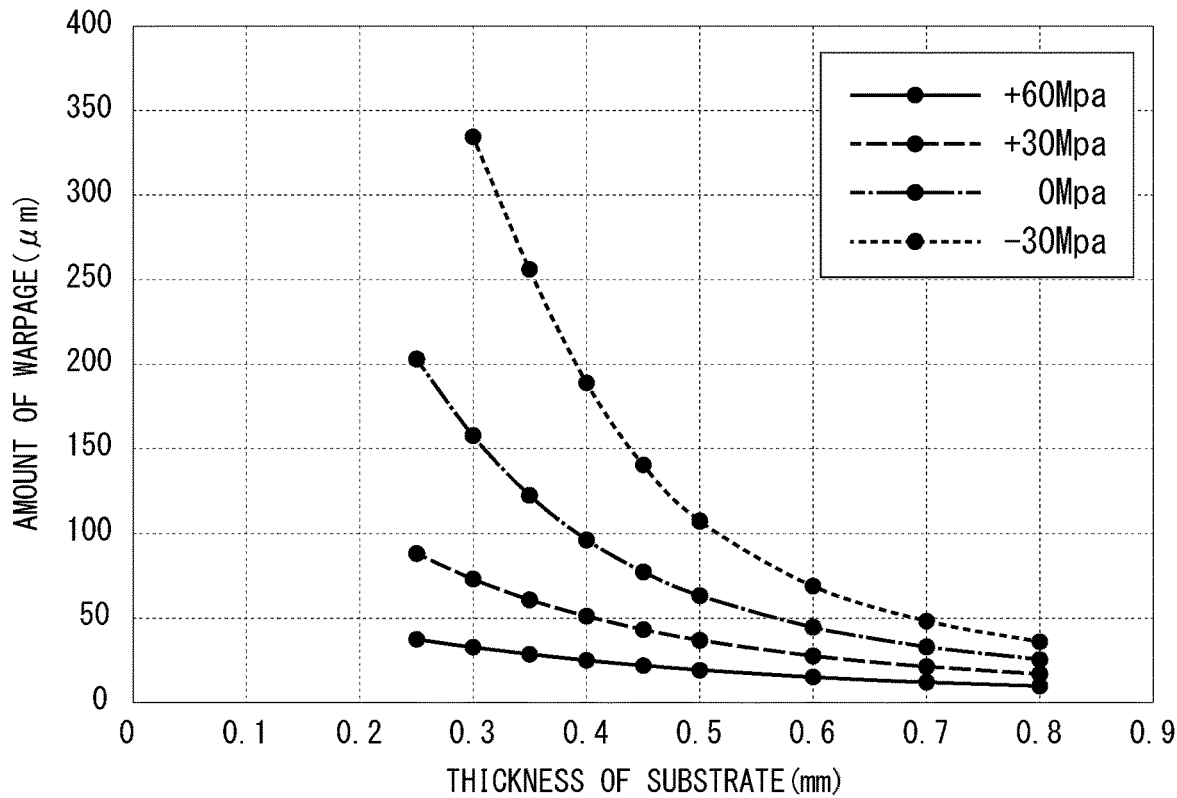
FIG. 8 shows simulation results of warpage of a SiC substrate in Example 3.
Figure 9:
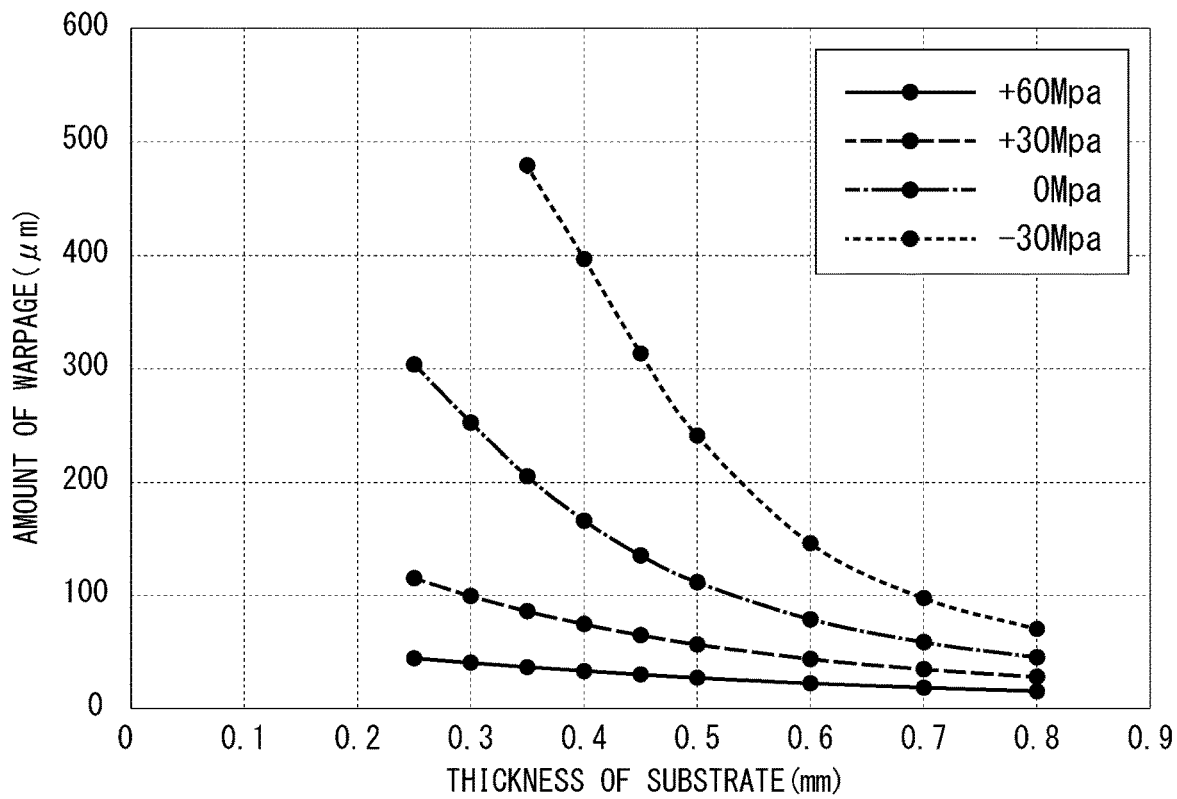
FIG. 9 shows simulation results of warpage of a SiC substrate in Example 4.
Figure 10:
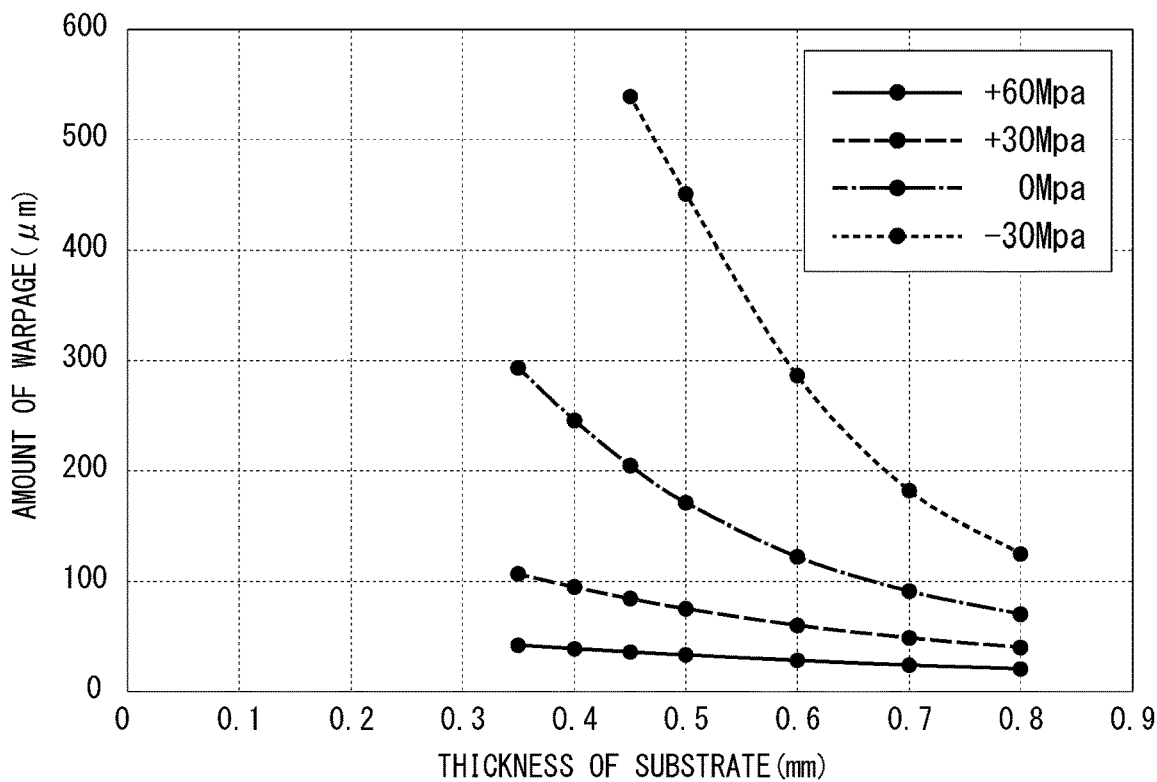
FIG. 10 shows simulation results of warpage of a SiC substrate in Example 5.
Figure 11:
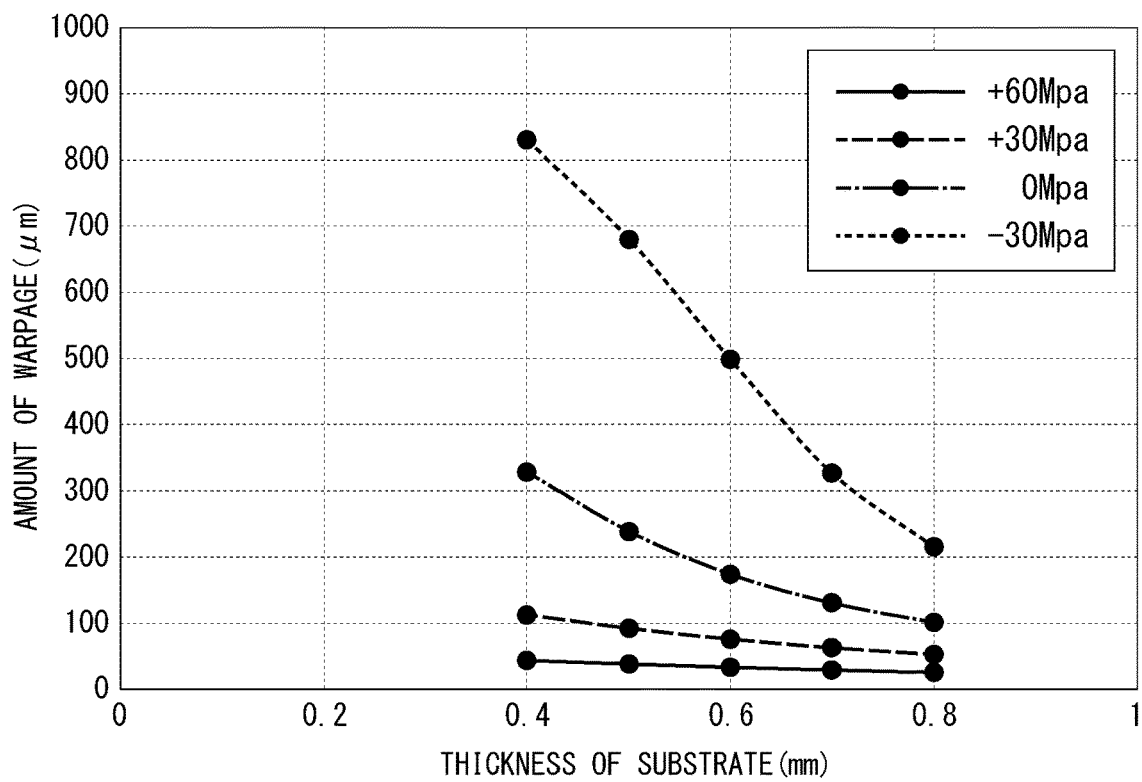
FIG. 11 shows simulation results of warpage of a SiC substrate in Example 6.

FIG. 5 is a schematic diagram showing a sublimation method, which is an example of a manufacturing device 30 of the SiC ingot. In FIG. 5, a direction orthogonal to a surface of a base 32 is a z direction, one direction orthogonal to the z direction is an x direction, and a direction orthogonal to the z direction and the x direction is a y direction.

The sublimation method is a method of disposing a seed crystal 33 made of SiC single crystal on the base 32 disposed in a crucible 31 made of graphite, supplying a sublimation gas sublimated from raw material powder 34 in the crucible 31 to the seed crystal 33 by heating the crucible 31, and growing the seed crystal 33 into a larger SiC ingot 35. The heating of the crucible 31 is performed by a coil 36, for example.

The diameter R of the SiC substrate 10 used to calculate the warpage factor F is a parameter determined by product specifications. For that reason, a desired SiC substrate 10 can be manufactured by controlling the thickness $t_s$ of the SiC substrate 10 and the stress S at the first outer circumferential end 1 in accordance with the defined diameter R of the SiC substrate 10.

First, by controlling crystal growth conditions in the sublimation method, the stress applied inside the SiC substrate 10 obtained from the SiC ingot 35 can be controlled.

For example, when the SiC ingot 35 is c-plane grown, a temperature of a central portion and a temperature of an outer circumferential portion of a crystal growth surface are controlled. The crystal growth surface is a surface during a growth process of crystal. For example, when the SiC ingot 35 is c-plane grown, the temperature of the outer circumferential portion is made lower than the temperature of the central portion of the crystal growth surface. In addition, crystal growth is performed such that a difference in growth rate between a center and an outer circumference in a xy plane becomes 0.001 mm/h or more and 0.05 mm/h or less. Here, the growth rate in the center in the xy plane is made slower than the growth rate in the outer circumference. By performing the crystal growth in this way, in a case in which the stress S at the first outer circumferential end 1 is compressive stress, its absolute value can be reduced, and in a case in which the stress S at the first outer circumferential end 1 is tensile stress, its absolute value can be increased. The growth rate is changed by changing the temperature of the crystal growth surface.

The temperature of the crystal growth surface can be adjusted by controlling a position of a heating center of the crucible 31 in the z direction heated by the coil 36. For example, the position of the heating center of the crucible 31 in the z direction can be changed by changing a position of the coil 36 in the z direction. The position of the heating center of the crucible 31 in the z direction and a position of the crystal growth surface in the z direction are controlled to be separated from each other by 0.5 mm/h. Here, the position of the heating center of the crucible 31 in the z direction is controlled to be lower (on the raw material powder 34 side) than the position of the crystal growth surface in the z direction.

Next, the SiC ingot 35 produced under these conditions is processed into the SiC substrate 10. In a general processing method, the stress applied to the single crystal changes depending on a state of the SiC ingot 35 and a state of the SiC substrate 10. For example, in a shaping process, it is required to reduce the diameter at the time of processing the SiC ingot 35 with a diameter of 180 mm into the SiC substrate 10 with a diameter of 150 mm. In addition, for example, in a multi-wire cutting process, undulations occur on the surface, and it is required to remove the undulations. By going through such a process, for example, a portion of the SiC ingot 35 having large stress may be removed or a shape of a crystal lattice plane may be changed, and the stress in the SiC ingot 35 state may be released in the SiC substrate 10 state. The SiC substrate 10 is processed such that the stress applied to the single crystal in the SiC ingot 35 state is transferred thereto.

For example, after damage-free processing has been performed on one surface of the SiC ingot 35, it is cut with a single wire saw, and the surface subjected to the damage-free processing is sucked to further perform damage-free processing on the cut surface. By performing the damage-free processing on both surfaces of the SiC substrate 10, part of the stress generated in the SiC ingot state is transferred to the SiC substrate 10. The damage-free processing is, for example, CMP processing. In this way, by processing the substrate to leave a lattice plane shape of the SiC ingot 35, the stress included in the SiC ingot 35 is transferred to the SiC substrate 10. After that, by performing the shaping process for adjusting the diameter, the stress at the first outer circumferential end 1 of the SiC substrate 10 can be adjusted.

Also, when the SiC ingot 35 is processed into the SiC substrate 10, the thickness $t_s$ of the SiC substrate 10 is determined. When the thickness $t_s$ of the SiC substrate 10 is reduced in order to increase the number of SiC substrates 10 obtained from the SiC ingot 35, production efficiency is improved, but the thickness $t_s$ of SiC substrate 10 is designed such that the warpage factor F is within a predetermined value. The lower limit value of the thickness $t_s$ of the SiC substrate 10 is predicted from the diameter R of the SiC substrate 10 and the stress at the SiC substrate 10 that can be predicted from the SiC ingot state, and the thickness $t_s$ of the SiC substrate 10 is set to be thicker than the above thickness.

In this way, by controlling the thickness $t_s$ of the SiC substrate 10 and the stress S at the first outer circumferential end 1 in accordance with the diameter R of the SiC substrate 10 specified by the specifications, the SiC substrate 10 according to the present embodiment having the warpage factor F equal to or less than a specified value can be produced.

As described above, the warpage factor F obtained from the diameter R, the thickness $t_s$, and the stress S of the SiC substrate 10 has a correlation with the amount of the warpage obtained from the simulation in the case in which the processed layer 11 is formed on the SiC substrate 10. Also, the simulation results in the case of forming the processed layer 11 on the SiC substrate 10 have a correlation with actually measured values. That is, by using the warpage factor F obtained from the diameter R, the thickness $t_s$, and the stress S of the SiC substrate 10, the warpage of the SiC substrate 10 after the processing processes can be easily predicted.

An allowable value of the warpage of the SiC substrate after the processing processes varies depending on specifications of products and processing processes. As described above, if the amount of the warpage of the SiC substrate after the processing processes can be predicted from the values of the diameter R, the thickness $t_s$, and the stress S of the SiC substrate 10 before processing, sorting of the SiC substrate 10 can be performed before it is processed, and probability of producing defective products in the processing processes can be lowered. In addition, by reducing the thickness $t_s$ of the SiC substrate 10 within a range in which the warpage does not occur in the processing processes, many SiC substrates 10 can be obtained from the SiC ingot 35, and production efficiency can be improved. The number of the SiC substrates 10 obtained from the SiC ingot 35 is increased, and defects in the processing processes due to the warpage are reduced, so that the cost per SiC substrate 10 can be reduced.

Although the preferred embodiments of the present invention have been described in detail above, the present invention is not limited to the specific embodiments, and various modifications and changes are possible within the scope of the gist of the present invention described in the claims.

EXAMPLES

Example 1

The warpage when the processed layer was laminated on the surface of the SiC substrate was obtained by simulation. The simulation was performed using the finite element method simulator ANSYS. It was separately confirmed that the simulation using the finite element method simulator ANSYS matched results of an actually manufactured product.

The simulation was performed according to the following procedure. First, physical property values of the SiC substrate and the surface layer with different stresses were set. The physical property values to be set are the thickness of the SiC substrate, the thickness of the surface layer, the Young's modulus, and the Poisson's ratio. The plate thickness of the SiC substrate was set to 350 μm. The diameter of the SiC substrate was set to 75 mm. The SiC substrate was set to have a Young's modulus of 480 GPa and a Poisson's ratio of 0.20. The film thickness of the surface layer was 0.01 mm. In consideration of the case in which stress is generated in the processed layer by ion implantation, the same values as those of the SiC substrate were used for the Young's modulus and the Poisson's ratio of the surface layer.

Then, the amount of the warpage of the SiC substrate was obtained by changing the thickness of the SiC substrate and the stress applied to the first outer circumferential end of the SiC substrate. The stress applied to the first outer circumferential end was obtained in four patterns of −30 MPa (compressive stress), 0 MPa, +30 MPa (tensile stress), and +60 MPa (tensile stress).

Example 2

Example 2 is different from Example 1 in that the SiC substrate has a diameter of 100 mm. Other conditions were the same as in Example 1, and the amount of the warpage of the SiC substrate was obtained by simulation.

Example 3

Example 3 is different from Example 1 in that the SiC substrate has a diameter of 150 mm. Other conditions were the same as in Example 1, and the amount of the warpage of the SiC substrate was obtained by simulation.

Example 4

Example 4 is different from Example 1 in that the SiC substrate has a diameter of 200 mm. Other conditions were the same as in Example 1, and the amount of the warpage of the SiC substrate was obtained by simulation.

Example 5

Example 5 is different from Example 1 in that the SiC substrate has a diameter of 250 mm. Other conditions were the same as in Example 1, and the amount of the warpage of the SiC substrate was obtained by simulation.

Example 6

Example 6 is different from Example 1 in that the SiC substrate has a diameter of 300 mm. Other conditions were the same as in Example 1, and the amount of the warpage of the SiC substrate was obtained by simulation.

FIG. 4 shows relationships between results of Examples 1 to 6 and the warpage parameter F. That is, it can be confirmed that there is a correlation between the simulation results of the warpage of the SiC substrate after forming the processed layer and the warpage parameter F of the SiC substrate before forming the processed layer.

Also, from the results of Examples 1 to 6, it can be seen that, as the diameter R of the SiC substrate becomes larger, the amount of the warpage of the SiC substrate after processing increases. In addition, from the results of Examples 1 to 6, it can be seen that, as the thickness $t_s$ of the SiC substrate becomes thinner, the amount of the warpage of the SiC substrate after processing increases. Further, from the results of Examples 1 to 6, it can be seen that, in a case in which the stress applied to the first outer circumferential end of the SiC substrate is compressive stress, as its absolute value becomes smaller, the amount of the warpage of the SiC substrate after processing increases, and in a case in which the stress applied to the first outer circumferential end of the SiC substrate is tensile stress, as its absolute value becomes larger, the amount of the warpage of the SiC substrate after processing increases. This result matches the fact that parameters for determining the warpage parameter F are obtained from the diameter R, the thickness $t_s$, and the stress S of the SiC substrate.

EXPLANATION OF REFERENCES

1 First outer circumferential end
2 Outer circumferential portion
10 SiC substrate
10a First surface
10b Second surface
11 Processed layer
C Center
R Diameter
S Stress

What is claimed is:

1. A SiC substrate having a warpage factor F of 300 μm or less represented by the following formula (1) obtained from a thickness, a diameter, and a stress at a first outer circumferential end 10 mm inward from an outer circumferential end in the [11-20] direction from a center thereof, $$F = K \times \exp(a + b \times \ln(\sigma) + c \times \ln(R) + d \times \ln(t_s)) \quad (1)$$

where K, a, b, c, and d are constants satisfying K=1.3373, a=−11.67123, b=1.4030953, c=1.8050972, and d=−1.585898, σ satisfies σ=60 (MPa)−⅔×S (MPa), S is internal stress in the <1-100> direction, which is the same direction as a circumferential direction of the first outer circumferential end, and in which tensile stress is defined as positive and compressive stress is defined as negative, $t_s$ is the thickness (mm), R is the diameter (mm), and Wherein the diameter is 290 mm or more.

2. The SiC substrate according to claim 1, wherein the warpage factor F is 200 μm or less.

3. The SiC substrate according to claim 1, wherein the warpage factor F is 100 μm or less.

4. The SiC substrate according to claim 1, wherein the warpage factor F is 50 μm or less.

5. The SiC substrate according to claim 1, wherein the diameter is 290 mm or more, and the thickness is 800 μm or less.

6. The SiC substrate according to claim 5,
wherein the thickness is 600 μm or less.

7. A SiC epitaxial wafer comprising the SiC substrate according to claim 1, and a SiC epitaxial layer laminated on one surface of the SiC substrate.

8. A SiC epitaxial wafer comprising the SiC substrate according to claim 2, and a SiC epitaxial layer laminated on one surface of the SiC substrate.

9. A SiC epitaxial wafer comprising the SiC substrate according to claim 3, and a SiC epitaxial layer laminated on one surface of the SiC substrate.

10. A SiC epitaxial wafer comprising the SiC substrate according to claim 4, and a SiC epitaxial layer laminated on one surface of the SiC substrate.

11. A SiC epitaxial wafer comprising the SiC substrate according to claim 5, and a SiC epitaxial layer laminated on one surface of the SiC substrate.

12. A SiC epitaxial wafer comprising the SiC substrate according to claim 6, and a SiC epitaxial layer laminated on one surface of the SiC substrate.

13. The SiC substrate according to claim 1,
wherein the SiC substrate having the warpage factor F of 300 μm or less is a SiC substrate before a processed layer is formed on a surface of the SiC substrate.

14. A SiC epitaxial wafer comprising the SiC substrate according to claim 13, and a SiC epitaxial layer laminated on one surface of the SiC substrate.

15. A SiC substrate having a warpage factor F of 100 μm or less represented by the following formula (1) obtained from a thickness, a diameter, and a stress at a first outer circumferential end 10 mm inward from an outer circumferential end in the [11-20] direction from a center thereof, $$F = K \times \exp(a + b \times \ln(\sigma) + c \times \ln(R) + d \times \ln(t_s)) \quad (1)$$

where K, a, b, c, and d are constants satisfying K=1.3373, a=−11.67123, b=1.4030953, c=1.8050972, and d=−1.585898, σ satisfies σ−60 (MPa)−⅔×S (MPa), S is internal stress in the <1-100> direction, which is the same direction as a circumferential direction of the first outer circumferential end, and in which tensile stress is defined as positive and compressive stress is defined as negative, $t_s$ is the thickness (mm), R is the diameter (mm), wherein the diameter is 145 mm or more.

16. The SiC substrate according to claim 15,
wherein the warpage factor F is 50 μm or less.

17. The SiC substrate according to claim 15,
wherein the thickness is 300 μm or less.

18. A SiC epitaxial wafer comprising the SiC substrate according to claim 15, and a SiC epitaxial layer laminated on one surface of the SiC substrate.

19. A SiC epitaxial wafer comprising the SiC substrate according to claim 16, and a SiC epitaxial layer laminated on one surface of the SiC substrate.

20. A SiC epitaxial wafer comprising the SiC substrate according to claim 17, and a SiC epitaxial layer laminated on one surface of the SiC substrate.

21. A SiC substrate having a warpage factor F of 200 μm or less represented by the following formula (1) obtained from a thickness, a diameter, and a stress at a first outer circumferential end 10 mm inward from an outer circumferential end in the [11-20] direction from a center thereof, $$F = K \times \exp(a + b \times \ln(\sigma) + c \times \ln(R) + d \times \ln(t_s)) \quad (1)$$

where K, a, b, c, and d are constants satisfying K=1.3373, a=−11.67123, b=1.4030953, c=1.8050972, and d=−1.585898, σ satisfies σ−60 (MPa)−⅔×S (MPa), S is internal stress in the <1-100> direction, which is the same direction as a circumferential direction of the first outer circumferential end, and in which tensile stress is defined as positive and compressive stress is defined as negative, $t_s$ is the thickness (mm), R is the diameter (mm), wherein the diameter is 195 mm or more.

22. The SiC substrate according to claim 21,
wherein the warpage factor F is 100 μm or less.

23. The SiC substrate according to claim 21,
wherein the warpage factor F is 50 μm or less.

24. The SiC substrate according to claim 21,
wherein the thickness is 600 μm or less.

25. The SiC substrate according to claim 21,
wherein the thickness is 400 μm or less.

26. A SiC epitaxial wafer comprising the SiC substrate according to claim 21, and a SiC epitaxial layer laminated on one surface of the SiC substrate.

27. A SiC epitaxial wafer comprising the SiC substrate according to claim 22, and a SiC epitaxial layer laminated on one surface of the SiC substrate.

28. A SiC epitaxial wafer comprising the SiC substrate according to claim 23, and a SiC epitaxial layer laminated on one surface of the SiC substrate.

29. A SiC epitaxial wafer comprising the SiC substrate according to claim 24, and a SiC epitaxial layer laminated on one surface of the SiC substrate.

30. A SiC epitaxial wafer comprising the SiC substrate according to claim 25, and a SiC epitaxial layer laminated on one surface of the SiC substrate.

* * * * *